United States Patent [19]
Aoki et al.

[11] Patent Number: 6,033,953
[45] Date of Patent: Mar. 7, 2000

[54] METHOD FOR MANUFACTURING DIELECTRIC CAPACITOR, DIELECTRIC MEMORY DEVICE

[75] Inventors: Katsuhiro Aoki, Tsuchiura; Yukio Fukuda, Tokai-mura, both of Japan; Ken Numata, Dallas; Yasutoshi Okuno, Richardson, both of Tex.; Akitoshi Nishimura, Ibaraki, Japan

[73] Assignee: Texas Instruments Incorporated, Dallas, Tex.

[21] Appl. No.: 08/991,132

[22] Filed: Dec. 16, 1997

[30] Foreign Application Priority Data

Dec. 27, 1996 [JP] Japan ..................... 8-358134

[51] Int. Cl.⁷ ............................... H01L 21/8242

[52] U.S. Cl. ................. 438/255; 438/3; 438/466

[58] Field of Search .................. 438/3, 253–256, 438/393–399, 466

[56] References Cited

U.S. PATENT DOCUMENTS

5,665,628  9/1997  Summerfelt ..................... 438/3
5,759,903  6/1998  Lehmann et al. .............. 438/386

*Primary Examiner*—Jey Tsai
*Attorney, Agent, or Firm*—Gerald E. Laws; William B. Kempler; Richard L. Donaldson

[57] ABSTRACT

A dielectric capacitor is provided which has a reduced leakage current. The surface of a first electrode (38) of the capacitor is electropolished and a dielectric film (40) and a second electrode (37) are successively laminated on it. The convex parts pointed end (38a) existing on the surface of the first electrode is very finely polished uniformly by dissolving according to electropolishing, a spherical curved surface in which the radius of curvature has been enlarged is formed, and the surface of the first electrode is flattened. Therefore, concentration of electrolysis can be prevented during the operation at the interface of the first electrode and the dielectric film, and the leakage current can be reduced considerably.

25 Claims, 6 Drawing Sheets

METHOD FOR MANUFACTURING DIELECTRIC CAPACITOR, DIELECTRIC MEMORY DEVICE

FIELD OF THE INVENTION

The present invention relates to a dielectric capacitor (in particular, a high-dielectric capacitor or ferroelectric capacitor) and dielectric memory device (in particular, a semiconductor memory which uses a high-dielectric capacitor or a ferroelectric capacitor), and the manufacturing method for these.

BACKGROUND OF THE INVENTION

Demand for high-dielectric memory devices or ferroelectric memory devices which use a high-dielectric capacitor or a ferroelectric capacitor as the semiconductor memory has been growing in recent years.

A high-dielectric capacitor is that which uses a high-dielectric material such as BSTO ((Ba, Sr) $TiO_3$) for the dielectric film and forms the cell capacitor of the memory cell in a DRAM (Dynamic Random Access Memory).

Also, by using a ferroelectric material such as PZT (Pb (Zr, Ti) $O_3$) for the dielectric film and forming a cell capacitor, a memory cell of FRAM (Ferroelectric Random Access Memory) which is a nonvolatile storage element that uses the residual polarization characteristic thereof is composed.

However, securing the capacitor area of the memory cell is becoming difficult as the enhancement in the integration progresses in, for example, DRAM. In order to deal with this problem, examinations have been made such as making the capacitor structure three-dimensional or using a material of high dielectric constant for the dielectric film.

Figure 6:
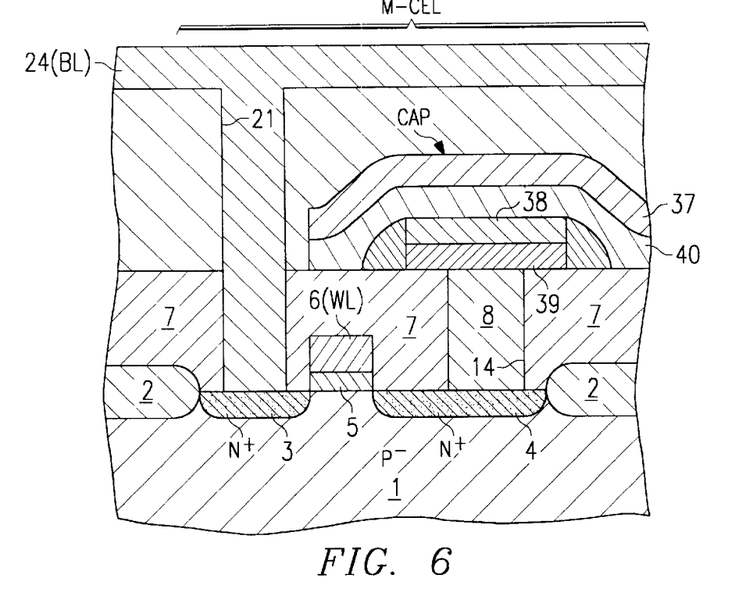
FIG. 6 is a sectional figure of the main part of a high-dielectric memory cell which integrated a high-dielectric capacitor.

The high-dielectric capacitor used in a memory cell uses, for example, a Pt/TiN/Ti or an Ir/TiN/Ti structure in which bottom electrode 38 composed of Pt or Ir is laminated on barrier metal layer 39 composed of TiN layer and Ti adhesive layer for preventing the diffusion of the electrode compositional components; high-dielectric thin film 40 such as BSTO, etc., is formed on this laminated body according to the sputtering method or the deposition method of an electron-beam heating system; and top electrode 37 composed of Pt or Ir is formed into an approximately identical pattern as shown in FIG. 6.

In this type of dielectric capacitor (Cap) and memory cell (M-Cel) shown in FIG. 6, the electrode of the capacitor is mainly formed by sputtering or vapor depositing platinum (Pt) when using BSTO for the dielectric film 12.

Figure 14:
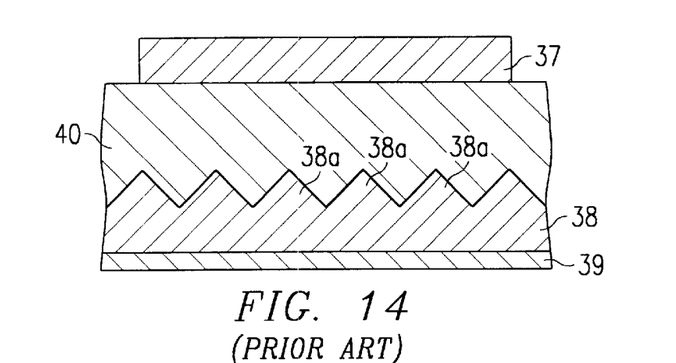
FIG. 14 is a schematic sectional figure showing the main part of a high-dielectric capacitor according to a conventional example.

However, as a result of having examined said platinum electrode, the present inventors found that the surface of said Pt bottom electrode 38 manifests a rough surface with many pointed convex parts 38*a* existing in an island shape as shown in FIG. 14. This is due to the fact that particles of Pt adhere in a conical shape from sputtering or vapor deposition.

In a dielectric capacitor, insulation property is one important performance but it was found that in the aforementioned structure, the leakage current is great and becomes the major defect for influencing the performance of the dielectric memory device. When the leakage current increases, the charge-storage state of the dielectric memory device fluctuates and erroneous operation or failure in the memory function may occur.

The objective of the present invention is to provide a high-performance dielectric capacitor and a dielectric memory device which greatly reduces or does not generate leakage current and a method for manufacturing these with favorable reproducibility.

SUMMARY OF INVENTION

As a result of having conducted examinations assiduously in order to achieve said objective, the present inventors focused their attention on the fact that leakage current is rate determined by the Schottky electron emission mechanism at the interface of said bottom electrode and dielectric film. Namely, they realized that the leakage current (electron emission) depends strongly on said convex part's radius of curvature at said interface and causes the electric field convergence at the convex part pointed end of the bottom electrode surface, discovered an effective method for greatly reducing the leakage current based on the recognition that to flatten the surface of the bottom electrode for laminating the dielectric film is very important, and achieved the present invention.

Namely, the present invention relates to a dielectric capacitor, in which a dielectric film (e.g., BSTO film: hereafter the same) and a second electrode (e.g., Pt electrode: hereafter the same) are successively laminated on the first electrode (e.g., Pt electrode: hereafter the same) and the surface of said first electrode on said dielectric film side is electropolished, and a dielectric memory device which has this dielectric capacitor in the memory cell.

Also, the present invention relates to a manufacturing method for a dielectric capacitor which executes a process of forming said first electrode, a process of immersing said first electrode in an electrolytic solution, and a process of electropolishing the surface of said first electrode by making said first electrode in said electrolytic solution into the anode and impressing a voltage between the counterelectrode, when manufacturing a dielectric capacitor successively laminated with a dielectric film and a second electrode on a first electrode.

According to the present invention, the pointed end of the convex part existing on the surface of said first electrode composed of Pt, etc., is very finely polished uniformly at the angstrom level according to electropolishing, dissolved in an electrolytic solution, changed gradually into a curved surface of spherical shape, and the flatness is increased by the increase in the radius of curvature of this curved surface. As a result, the surface of the first electrode is flattened effectively and sufficiently so electric field convergence is avoided during the operation and leakage current decreases considerably.

In the dielectric capacitor, dielectric memory device, and manufacturing method for these in the present invention, it is preferable for the surface of the thin film formed as said first electrode to be flattened by electropolishing according to a physical deposition method such as the sputtering method, the deposition method of an electron-beam heating system, etc.

In this case, said first electrode and said second electrode are, for example, Pt thin film. Also, it is preferable for said dielectric film to be formed with a ferroelectric film such as PZT, etc., or a high-dielectric film such as BSTO, etc.

Also, it is preferable to form said dielectric film on the electropolished surface of said first electrode and form said second electrode composed of Pt, etc., on this dielectric film.

Also, it is preferable to make the radius of curvature at the opposing extreme end part of said counterelectrode with respect to said anode 1–50 mm and the space between said counterelectrode and said first electrode 5–100 mm during said electropolishing.

Furthermore, it is preferable to adjust the impressed voltage and the temperature of said electrolytic solution so that a high ion concentration area is formed in the vicinity of said anode.

In addition, it is preferable to scan said counterelectrode by maintaining the distance between said counterelectrode and said first electrode to be within a prescribed range and impressing a prescribed voltage between the two.

REFERENCE NUMERALS AND SYMBOLS AS SHOWN IN THE DRAWINGS

In the figures, 6 represents a word line, 8 a polysilicon layer, 16 an aqua regia, 17 a platinum rod, 18 a substrate, 19 an insulation layer, 24 a bit line, 37 a top electrode, 38 a bottom electrode, 38a, 38a' convex parts, 38b a concave part, 39 a barrier metal layer, 40 a high-dielectric film, (Cap) a high-dielectric capacitor, (M-Cel) a memory cell.

DESCRIPTION OF EMBODIMENTS

Below, application examples of the present invention will be explained.

FIGS. 1A–1D are schematic sectional figures showing, with regards to the main part, an example of the process from formation of the bottom electrode to the formation of the top electrode based on the present invention.

Figure 1A:
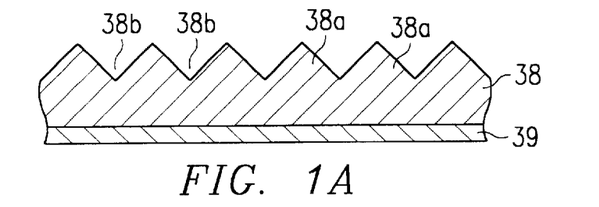
FIGS. 1A–1D are schematic sectional figures successively showing the manufacturing process of a high-dielectric capacitor according to an application example of the present invention.

Namely, FIG. 1A shows a state of having formed bottom electrode 38 composed of Pt, etc., in a thickness of, for example, about 1000 Å on barrier metal layer 39 composed of a TiN layer and a Ti adhesive layer as was noted above according to the vacuum vapor deposition method (or sputtering method), and as in what was discussed above, pointed (very small radius of curvature) convex part 38a and convex part 38b exist, for example, in a saw-toothed shape on the surface of bottom electrode 38.

Figure 1B:
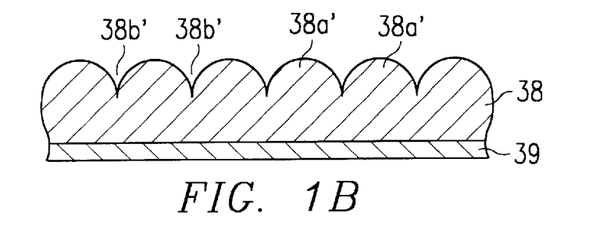

Then the pointed end part of convex part 38a at the surface is polished as shown in FIG. 1B by electropolishing bottom electrode 38 in the condition to be noted later, becomes convex part 38a' flattened into a spherical curved surface in which the radius of curvature has been enlarged, and in accordance, concave part 38b' between the convex parts becomes shallow. In this application example, the surface of Pt bottom electrode 38 is flattened into a size of angstrom level.

Figure 1C:
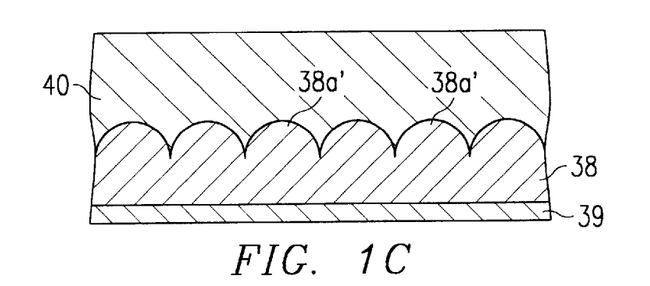
Figure 1D:
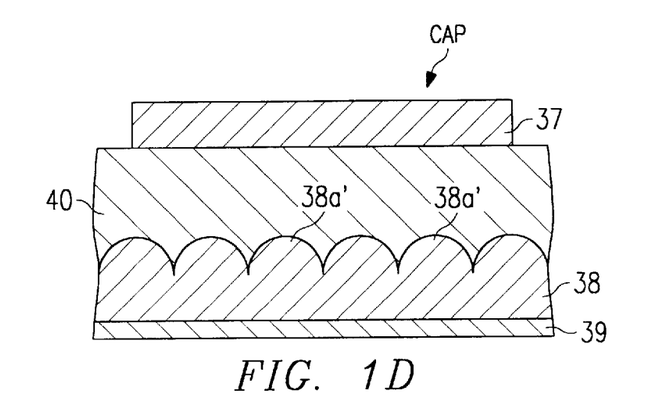

High-dielectric film 40 of BSTO, etc., is laminated on bottom electrode 38 thus flattened according to the sputtering method, etc., as shown in FIG. 1C. Furthermore, top electrode 13 composed of Pt, etc., is formed on it according to the vacuum vapor deposition method (or sputtering method) as shown in FIG. 1(D) to fabricate high-dielectric capacitor (Cap).

Figure 2A:
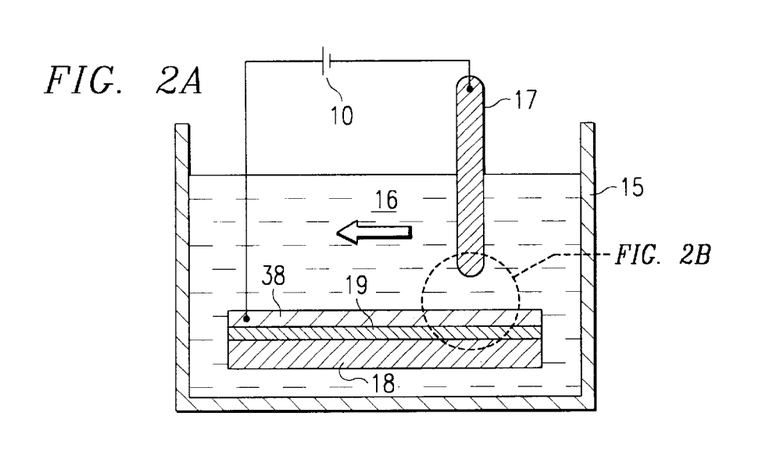
FIGS. 2A–2B are schematic sectional figures showing the electropolishing method of the bottom electrode according to said application example of the present invention.
Figure 2B:
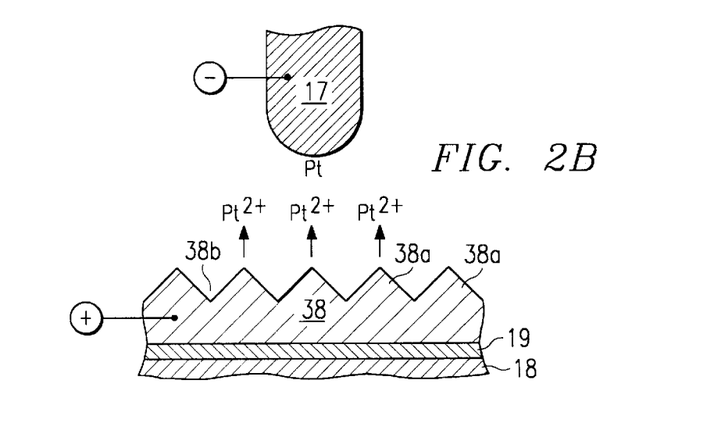

FIGS. 2A–2B are schematic sectional figures showing a test example for forming bottom electrode 38 as noted above.

In this test, Pt layer 38 was deposited according to the vapor deposition method of electron-beam heating system in a thickness of about 1000 Å on substrate 18 composed of a silicon wafer formed with $SiO_2$ layer 19 according to the thermal oxidation method, and a laminated body similar to FIG. 1A was fabricated.

Then, by immersing this in electrolytic bath 15 input with electrolytic solution 16 composed of a suitably heated (preferably about 30–70° C.) aqua regia (mix ratio of concentrated hydrochloric acid:concentrated nitric acid:water=3:1:4) as shown in FIG. 2A, connecting Pt layer 38 on substrate 18 to the anode of direct-current power source 10 so as to be made into the anode, using a platinum rod (however, the rod diameter is shown as being thin in FIG. 2B to make it easy to understand) which was processed so that the radius of curvature of the extreme end (bottom end) becomes about 1–50 mm as cathode 17 as the counterelectrode, and making the distance between these two electrodes 38 and 17 5–100 mm, refined processability according to electropolishing was improved. If the radius of curvature at the extreme end of cathode 17 or the distance between the electrodes is smaller than said range, the processability in the electropolishing tends to decrease and if it is greater, the electric current distribution becomes nonuniform and the processability in the electropolishing tends to decrease. Sufficient electric current density is obtained according to said range for the radius of curvature of the rod. Aqua regia 16 was not stirred hard.

Said platinum rod 17 was scanned as indicated with the arrow in FIG. 2A at a high speed while maintaining a prescribed spacing from Pt layer 38 and locally converging the electric current. This scan pattern can be, for example, a meandering shape or multiple rods 17 can be scanned simultaneously.

FIG. 2B is an enlarged figure of the b part in FIG. 2A and shows the mechanism of the electropolishing. Namely, when a voltage is impressed to Pt layer 38 (anode) in the state of FIG. 2B, the Pt atoms at the pointed end part of convex part 38a in Pt layer 38 are ionized and become ions ($Pt^{2+}$), they are emitted into electrolytic solution 16, reduced in platinum rod 17 (cathode), and precipitated as metal Pt. Then a voltage is impressed so that $pt^{+2}$ is accumulated within concave parts 38b between convex parts 38a of Pt layer 38 as will be discussed later and a Pt ion concentrated region is formed; then, operation is executed so as to ionize and dissolve only Pt in convex part 38a.

This type of phenomenon is created during the operation of platinum rod 17 in the direction of the arrow and by this being repeated in each convex part 38a, the pointed end part of each convex part 38a is electropolished, gradually shaved away, and it changes into a spherical surface shape in which the radius of curvature has been enlarged (in this case, the vicinity of concave part 38b is formed into a high-concentration region of accumulated Pt ions but does not adhere). This type of phenomenon can be verified by a current-voltage curve expressing the change in the electric current with respect to changes in the anode voltage (voltage of Pt layer 38 as shown in FIG. 3.

Figure 3:
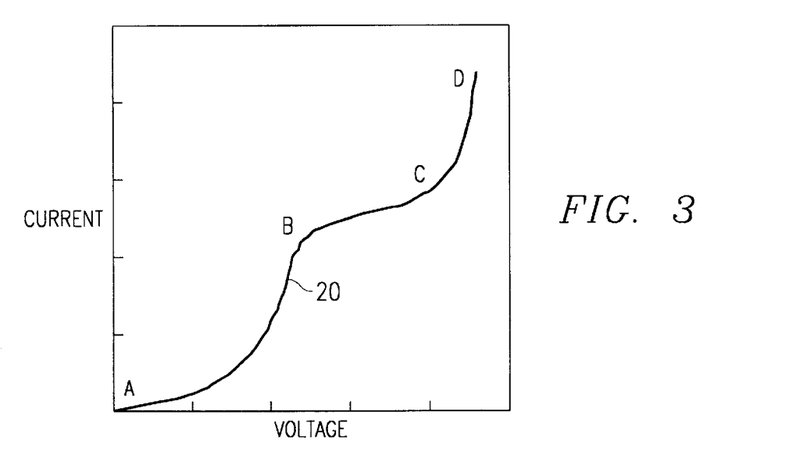
FIG. 3 is a graph showing the current-voltage curve accompanying the electrolysis according to said application example of the present invention.

Namely, in the A–B area of the current-voltage curve 20 shown in FIG. 3, a state of Pt atoms dissolving rapidly from the relatively weak part such as the crystal grain boundary of convex part 38a in FIG. 2B is shown. When the voltage is raised further, even as the voltage is increased the current does not increase as much in accordance with the B–C area. Namely, in this area, diffusion of metal ions ($Pt^{2+}$) is delayed with respect to dissolution of Pt layer 38 (anode) so ions accumulate in the vicinity of Pt layer 38 and dissolution progresses exclusively at the pointed end part of microscopic convex part 38a on the surface of Pt layer 38 as shown in FIG. 2B.

When the voltage is raised further and the potential of the Pt layer 38 is increased, a noticeable increase in the current is recognized since dissolution of Pt layer 38 and generation of oxygen occur simultaneously as shown in the C–D area.

From what was noted above, it is apparent that the voltage-impressing condition in the B–C area has an effect of flattening (namely polishing of convex part 38a) the surface of Pt layer 38 according to electropolishing.

In electrolysis which used a cyan solution or a generic acidic solution such as sulfuric acid, etc., in flattening the Pt surface by electropolishing, Pt does not dissolve at all, but when Pt is immersed in aqua regia (mixed ratio of concentrated hydrochloric acid:concentrated nitric acid:water= 3:1:4) 16 and the temperature of aqua regia 16 is heated to over 50° C., the dissolving speed of Pt becomes high. This is an advantageous condition for electropolishing of Pt.

In order to form a spherical curved surface by electropolishing convex part 38a of the Pt layer 38 surface as noted above, it is important to form said high ion concentrated area in the vicinity of Pt layer 38. For this, by setting the temperature of aqua regia 16 at 50–60° C. to promote dissolution from the extreme end of convex part 38a and impressing a voltage corresponding to the B–C area in FIG. 3, the electropolishing condition can be set advantageously.

Generally, heating to 70° C. and above is necessary in order to dissolve a material chemically but to execute the electropolishing process at a temperature condition in which the dissolution speed is very slow as noted above is the major characteristic of the present application example. Also, using rod 17 provided with a curvature at the extreme end in order to increase the current density is also the characteristic.

According to the present invention, dissolution within concave part 38b does not progress easily and forming convex part 38a into a spherical curved surface becomes easy due to dissolution of the Pt particles on the Pt layer 38 surface starting from the vicinity of the extreme end of convex part 38a during said electropolishing and the Pt ions being accumulated at a high concentration in the vicinity of concave part 38b. Also, the extreme end of platinum rod 17 is formed into a curved surface so the current can be converged locally, the entire surface of the Pt layer can be polished equally by scanning the Pt layer with this platinum rod 17, and the power consumption can be minimal.

When the surface of Pt layer 38 with film thickness of 100 nm formed according to the electron-beam vapor deposition method is observed with AFM (atomic force microscopy), a state in which Pt particles of grain size 200 Å are laid out on the entire surface can be observed. The grain density within the area N is estimated to be 2500 grains/$\mu m^2$. Here, these Pt particles are similar to that in which extreme end angle 2 with curvature of r at the extreme end composes a conical shape of 60 degrees.

Figure 4A:
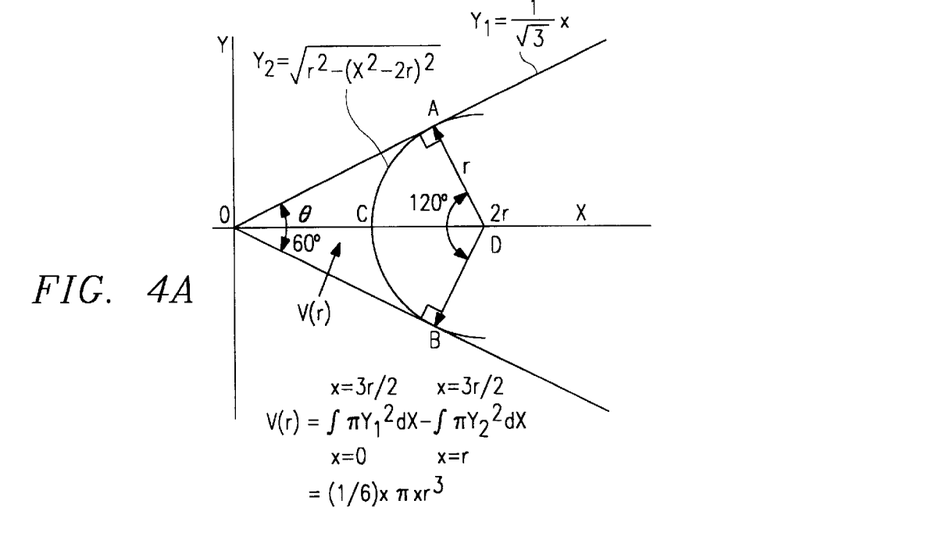
FIGS. 4A–4B are explanatory figures of the local electric field and a theoretical explanatory figure of electropolishing according to said application example of the present invention.

FIG. 4A theoretically shows said electropolishing mechanism with conical shape Pt particles (that which forms said convex part 38a) in which the extreme end angle is 60 degrees as a model.

In FIG. 4A, $Y_1$ is the conical slanted surface (AO or BO) and is expressed with $$Y_1 = (1/\sqrt{3})X$$

Also, $Y_2$ is the curved surface (ACB) of the convex part surface after electropolishing and is expressed with $$Y_2 = \sqrt{(r^2 - (X^2 - 2r)^2)}$$

V(r) is the cubic measurement of the part surrounded by AOBC removed by electropolishing and is expressed with $$V(r) = \int_{X=0}^{X=3r/2} \pi Y_1^2 \, dX - \int_{X=r}^{X=3r/2} \pi Y_2^2 \, dX = (1/6) \times \pi \times r^3$$

Therefore, when the extreme end curvature of Pt particles changes from $r_1$ to $r_2$ according to electropolishing, the Pt weight dissolved with respect to particle 1 is expressed with the following equation 1.

$$\Delta m_1 = 21.45 \times \frac{1}{6} \times \pi \times (r_2^3 - r_1^3) \tag{1}$$

Also, precipitation amount (or electrolysis amount) of metal $\Delta m_2$ is expressed with the following Faraday's equation 2.

$$\Delta m_2 = (M \times I \times t)/(n \times N \times e) \tag{2}$$

{m: atomic weight of metal (Pt is 195.09)

I: electric current value t: time

N: Avogadro's number ($6.02 \times 10^{23}$)

n: numeric value of metal (Pt is 2)

e: basic charge ($1.6 \times 10^{-19}$ C)}

Therefore, Pt weight ionized according to electrolysis is expressed with the following equation 3.

$$\Delta m_2 = \{195.09/(e \times 2 \times 6.02 \times 10^{23})\} \times I \times t$$

In aforementioned equation 1, $r_1 = 20$ Å

$r_2 = 60$ Å

$\Delta m_1 \times L \times 10^8 = \Delta m_2$ (However, L is the density within the area of the particles and is about 2500 grains/$\mu m^2$) if I×t in equation 3 is solved, it becomes $$I \times t = 3.5 \times 10^{-12} (C/cm^2)$$

and the fact that electropolishing at a very small quantity of electricity is possible, can be estimated easily.

Conductive mechanism (leakage current J) of the capacitor formed by depositing a BSTO thin film on a Pt electrode flattened by being electropolished as noted above is rate determined by Schottky electron emission as indicated in the following equation 4. This is based on the notation in Jpn. J. Appl. Phy., Vol. 33 (1994) pp. 5255–5258.

$$J = A \cdot T^2 \exp(-q(\Phi_B - \sqrt{(qE/4\pi\epsilon i)})/kT) \quad (4)$$

{$\sqrt{(qE/4\pi\epsilon i)}$: Item which indicates the reduced part in the barrier height according to Schottky effect E: Average electric field strength A: Richardson constant T: Temperature}

In equation 4, E indicates the average electric field strength, but when attention is given to the interface between the dielectric film and the Pt electrode, it is impossible to ignore the local field which is dependent on the curvature at the extreme end of the Pt particle. Therefore, if the radius of curvature at the extreme end of the Pt particle is r, the thickness of the dielectric film is d, and the impressed voltage is V, local electric field E' is according to FIG. 4(B) and the following computation below, $$E' = \{(r+d)/r\}(V/d) \quad (5)$$

Figure 4B:
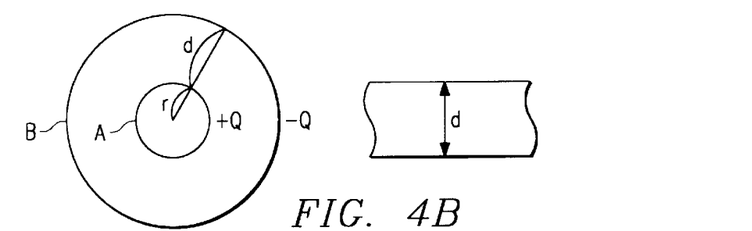

Here, if V and d are fixed, E' becomes smaller the larger the radius of curvature r is. Therefore, it is apparent that $\Phi_B - \sqrt{(qE/4\pi\epsilon i)}$ indicated in equation 4 becomes large and leakage current J decreases.

In explaining equation 5, a spherical capacitor will be considered regarding the local field in FIG. 4(B). An assumption will be made that charge +Q is accumulated in the A sphere and −Q in the B sphere.

The electric field at this time is $E = (Q/4\pi\epsilon) \cdot (1/r^2)$.

It is expressed with $$\therefore \text{Potential } V_s \text{ of } A = \int_a E dr = (Q/4\pi\epsilon)\{(1/r) - 1/(r+d)\} = (Q/4\pi\epsilon) \cdot \{(d/r(r+d)\} \quad (6)$$

If the charge density is δ, it becomes $$V_s = \{\delta \times 4\pi (r+d)^2 / 4\pi\epsilon\} \cdot d/r(r+d) = (\delta/\epsilon) \cdot \{(r+d)/r\} \cdot d \quad (7)$$

by substituting $Q = \delta \times 4\pi(r+d)^2$ in 6.

Voltage $V_p$ of a parallel plate with charge density δ becomes $$V_p = (d/\epsilon) \cdot d \quad (8)$$

From 7 and 8, it becomes a voltage of (r+d)/r multiple with respect to a plate at the spherical surface. Therefore, surface voltage $V_s$ of spherical surface A becomes $$V_s = \{(r+d)/r\} \cdot V \quad (9)$$

$$\therefore E = V_s/d = \{(r+d)/r\} \cdot (V/d) \quad (5)$$

Figure 5:
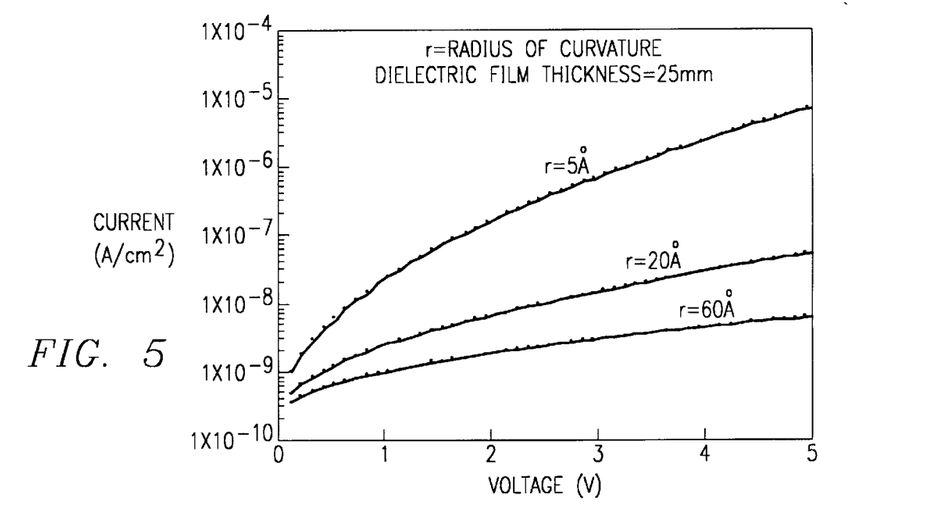
FIG. 5 is a graph showing the interfacial curvature dependence of the current-voltage characteristic according to said application example of the present invention.

FIG. 5 is a graph showing the interfacial curvature dependence of the current-voltage characteristics of the capacitor obtained according to computation.

The characteristic curves corresponding to radius of curvature r=5 Å, 20 Å, and 60 Å in FIG. 5 indicate current-voltage curves obtained by computing from aforementioned equation 4 and equation 5. Here, it was computed with the dielectric film thickness as t=25 nm (250 Å), the temperature at room temperature (T=298 K), and Richardson constant A=120 amp/$cm^2/K^2$.

Even from the results in FIG. 5, it is apparent that leakage current J decreases noticeably according to an increase in the radius of curvature (increase in electropolishing time). Therefore, by increasing the radius of curvature at the extreme end of the Pt particle according to the electropolishing method, it is possible to greatly reduce the leakage current of the capacitor.

From what was noted above, it is apparent that the leakage current of a high-dielectric capacitor of, for example, a Pt/BSTO/Pt structure strongly depends on the radius of curvature of the convex part of the Pt layer at the interface due to being rate determined by the Schottky electron emission mechanism of the BSTO/Pt interface. Therefore, in order to reduce the leakage current, flattening the irregularities of the Pt layer surface formed by the vapor deposition method of electron-beam heating system or the sputtering method according to the electropolishing method of the present application example is effective and by applying this as shown in FIG. 1, a high-dielectric capacitor of high performance and low leakage current can be manufactured with favorable reproducibility.

Next, the fabrication process like that which is noted below for bottom electrode 38 of the capacitor in memory cell (M-Cel) applied with the aforementioned method will be explained regarding FIGS. 6–13. Here, explanation will be given with regards to the CUB (Cell Under Bitline) type.

Figure 7:
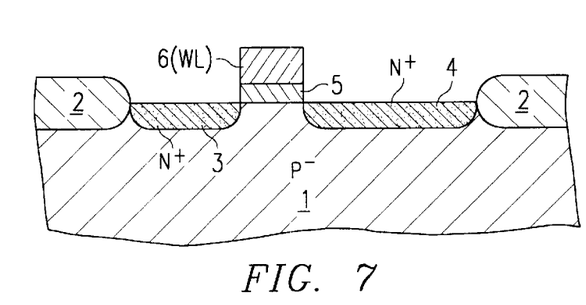
FIG. 7 is a sectional figure of the main part showing one manufacturing step of said memory cell.

First of all, as shown in FIG. 7, field oxide film 2 is formed on P⁻ type silicon substrate (wafer) 1 by the selective oxidation method, gate oxide film 5 according to the thermal oxidation method and polysilicon word line 6 (WL) according to the chemical vapor deposition method are formed respectively; then, after patterning these, N⁺ drain region 3 and source region 4 are formed respectively by thermal diffusion of N-type impurities such as As, etc.

Figure 8:
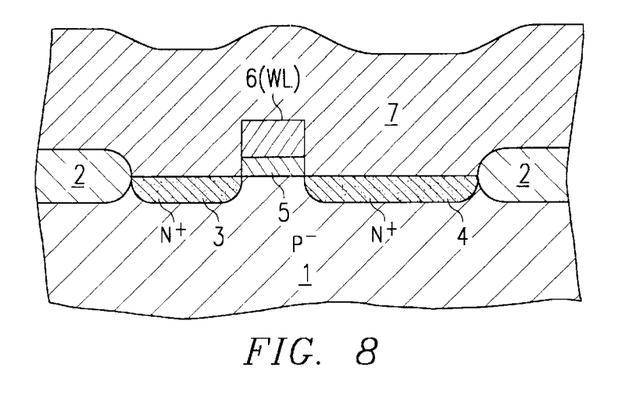
FIG. 8 is a sectional figure of the main part showing another manufacturing step of said memory cell.
Figure 9:
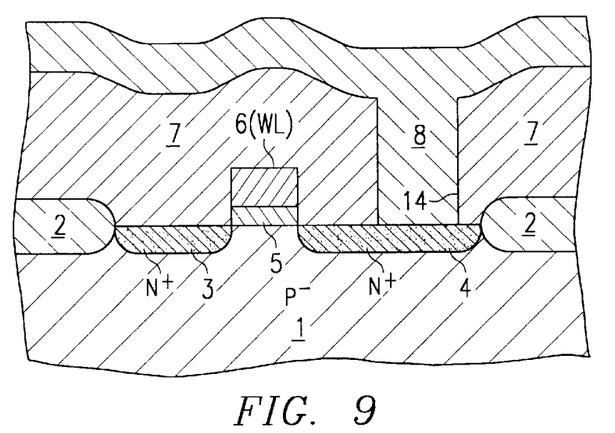
FIG. 9 is a sectional figure of the main part showing another manufacturing step of said memory cell.

Next, after depositing SiO₂ insulation layer 7 by the chemical vapor deposition method on the entire surface, insulation layer 7 is etched using a photoresist mask (not shown in the figure) as shown in FIG. 8, and contact hole 14 is formed on source region 4 into a prescribed shape as shown in FIG. 9. Then, polysilicon layer 8 is adhered by the chemical vapor deposition method on the entire surface including contact hole 14 so as to contact source region 4.

Figure 10:
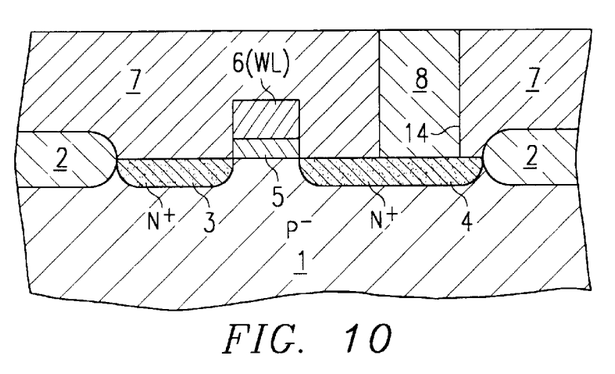
FIG. 10 is a sectional figure of the main part showing another manufacturing step of said memory cell.

Next, the surfaces of polysilicon layer 8 as the storage node and SiO₂ layer 7 are flattened by etch back according to plasma etching or chemical mechanical polishing/planarization (CMP) as shown in FIG. 10.

Here, if said flattening process is not executed, namely, if the top layer is laminated with the gradation left as is, the covering property of the top layer degrades and becomes a cause for leakage current and film separation.

Figure 11:
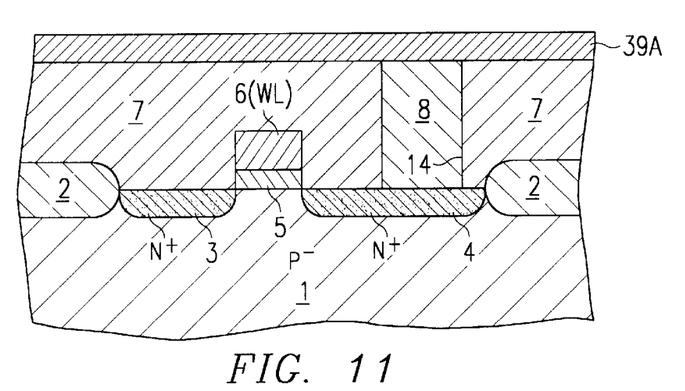
FIG. 11 is a sectional figure of the main part showing another manufacturing step of said memory cell.
Figure 12:
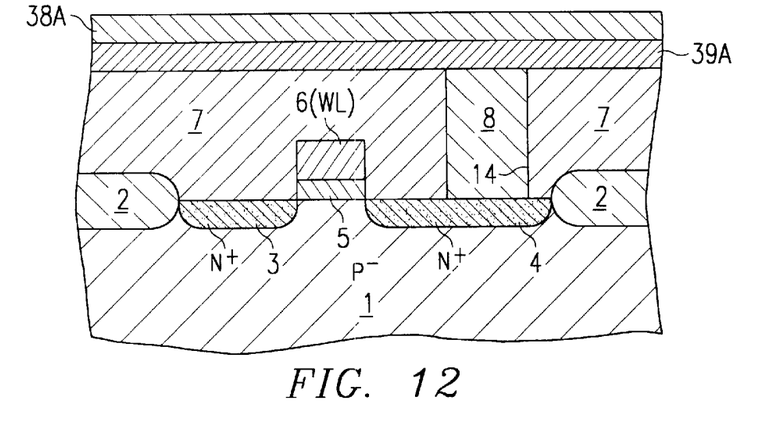
FIG. 12 is a sectional figure of the main part showing another manufacturing step of said memory cell.

Next, material 39A for the barrier metal layer composed of Ti adhesive layer and TiN layer is sputtered or vapor deposited on said flattened surface as shown in FIG. 11; then, bottom electrode material layer 38A composed of Pt is sputtered or vapor deposited as shown in FIG. 12.

Figure 13:
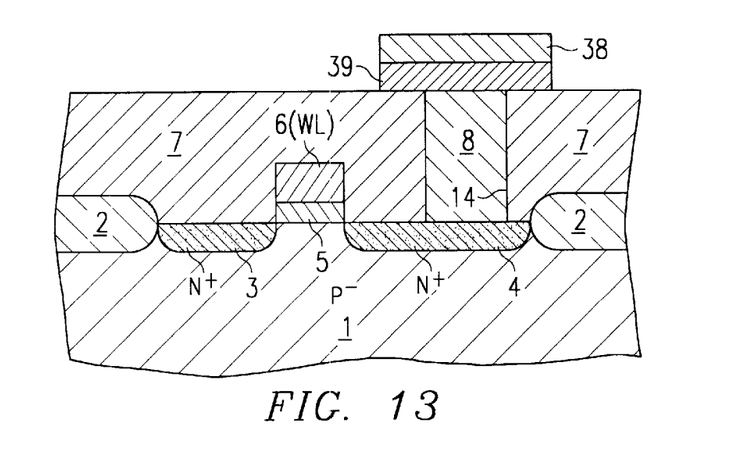
FIG. 13 is a sectional figure of the main part showing yet another manufacturing step of said memory cell.

Next, bottom electrode 38 and barrier metal layer 39 are etched into approximately the same pattern using a photoresist mask (not shown in the figure), and bottom electrode 38 is formed as shown in FIG. 13.

Next, high-dielectric thin film 40 of BSTO, etc., is formed on bottom electrode 38 by the sputtering method or the vapor deposition method of electron-beam heating system and top electrode 37 composed of Pt or Ir is formed into approximately the same pattern as shown in FIG. 6. Then, contact hole 21 is formed through insulation layer 7 and insulation layer 19 adhered on the entire surface, bit line 24 is adhered here, and memory cell (M-Cel) is completed.

An application example of the present invention was explained above, but the aforementioned application example can be modified further based on the technological concept of the present invention.

For example, the shape of said electrode rod 17 can be changed and not only one, but multiple ones can be used simultaneously. Even with regards to the impressed voltage, voltage impression including a time-fluctuation component is also possible.

Also, said electropolishing method is applicable in flattening the surface of an electrode of tungsten, aluminum, etc., using an inorganic acidic solution such as sulfuric acid, nitric acid, etc., as an electrolytic solution.

Also, as the method for depositing an electrode, other methods such as CVD, etc., can be used in addition to the sputtering method and vacuum vapor deposition method.

Also, as the material for said dielectric film 40, it is possible to use dielectrics such as strontium titanate, [lead] zirconate titanate (PZT), tantalum oxide, etc., in addition to BSTO.

As electrodes 38 and 37, rare metals such as Ir, etc., can be used in addition to Pt and as the barrier metal, TaN, TaSiN, and TiAlN can be used.

Furthermore, the present invention can naturally be applied to aforementioned DRAM, FRAM, and other devices.

In the present invention, the surface of the first electrode is electropolished and a dielectric film and a second electrode are successively laminated on it as was noted above so the convex part's pointed end existing on the surface of the first electrode is very finely polished uniformly by dissolving according to electropolishing, a spherical curved surface in which the radius of curvature has been enlarged is formed, and the surface of the first electrode is flattened. Therefore, concentration of electrolysis can be prevented during the operation at the interface of the first electrode and the dielectric film, and the leakage current can be reduced considerably.

we claim:

1. A manufacturing method for a dielectric capacitor which executes a process of forming said first electrode, wherein said electrode has a thickness of less than approximately 1000 Å, said first electrode having a rough surface with many pointed convex parts, a process of immersing said first electrode in an electrolytic solution, and a process of electropolishing the surface of said first electrode by making said first electrode in said electrolytic solution into an anode and impressing a voltage between said anode and a counterelectrode, the voltage selected such that said pointed convex parts are rounded off, whereby a flattened surface is formed on said first electrode, when manufacturing a dielectric capacitor successively laminated with a dielectric film and a second electrode on a first electrode.

2. The method of claim 1, which forms said first electrode according to a physical deposition method.

3. The method of claim 1, which forms said dielectric film on the electropolished surface of said first electrode and forms said second electrode on this dielectric film.

4. The method of claim 1, which forms said first electrode and said second electrode with a platinum thin film.

5. The method of claim 1, which forms said dielectric film with a high-dielectric substance or a ferroelectric substance.

6. The method of claim 1, which makes the radius of curvature at the opposing extreme end part of said counterelectrode with respect to said anode 1–50 mm and the space between said counterelectrode and said anode 5–100 mm.

7. The method of claim 1, which adjusts the impressed voltage and the temperature of said electrolytic solution so that a high ion concentration area is formed in the vicinity of said anode.

8. The method of claim 1, which scans said counterelectrode by maintaining the distance between said counterelectrode and said anode to be within a prescribed range and impressing a prescribed voltage between the two.

9. A manufacturing method for a dielectric memory device, which fabricates a dielectric capacitor in a memory cell according to the method of claim 1.

10. A process of manufacturing a memory device having a dielectric capacitor with a first and second electrode, comprising the steps of:

forming a first electrode layer on a semiconductive substrate, said first electrode layer having a thickness of less than approximately 1000 Å, said first electrode layer having a rough surface with many pointed convex parts;

immersing said first electrode layer in an electrolytic solution;

electropolishing the surface of said first electrode layer by connecting said first electrode layer in said electrolytic solution as an anode and impressing a voltage between said first electrode layer and a cathode, such that said pointed convex parts are rounded off, whereby a flattened surface is formed on said first electrode layer;

etching said first electrode layer to form said first electrode; and forming a dielectric film and said second electrode on said electropolished first electrode.

11. The method of claim 10, which forms said first electrode layer according to a physical deposition method.

12. The method of claim 10, which forms said dielectric film on the electropolished surface of said first electrode layer and forms said second electrode on this dielectric film.

13. The method of claim 10, which forms said first electrode and said second electrode with a platinum thin film.

14. The method of claim 10, which forms said dielectric film with a high-dielectric substance or a ferroelectric substance.

15. The method of claim 10, wherein said cathode has a radius of curvature at an opposing extreme end part of said cathode with respect to said anode in the range of 1–50 mm; and wherein the space between said opposing extreme of said cathode and said anode is in the range of 5–100 mm.

16. The method of claim 10, further comprising the step of adjusting the impressed voltage and the temperature of said electrolytic solution so that a high ion concentration area is formed in the vicinity of said anode.

17. The method of claim 10, further comprising the step of scanning said cathode over the surface of said first electrode layer while maintaining a distance between said cathode and said anode to be within a prescribed range and impressing a prescribed voltage between the two.

18. The method of claim 17, wherein the step of scanning includes a plurality of similar cathodes.

19. The method of claim 10, wherein the electrolytic solution is aqua regia and the electrolytic solution has a temperature in the range of 30–70° C.

20. A process of manufacturing a memory device having a dielectric capacitor with a first and second electrode, comprising the steps of:

forming a transistor on a semiconductive substrate;

forming an insulative layer above the transistor;

forming a first electrode layer over a barrier metal layer on the insulative layer such that said electrode has a thickness of less than approximately 1000 Å, said first electrode layer having a rough surface with many pointed convex parts;

forming an interconnection between the transistor and the first electrode layer;

immersing said first electrode layer in an electrolytic solution;

electropolishing the surface of said first electrode layer by connecting said first electrode in said electrolytic solution as an anode and impressing a voltage between said first electrode layer and a cathode, such that said pointed convex parts are rounded off, whereby a flattened surface is formed on said first electrode layer, etching said first electrode layer and said barrier metal layer to form said first electrode; and forming a dielectric film and said second electrode on said electropolished first electrode.

21. The method of claim 20, wherein said cathode has a radius of curvature at an opposing extreme end part of said cathode with respect to said anode in the range of 1–50 mm; and wherein the space between said opposing extreme of said cathode and said anode is in the range of 5–100 mm.

22. The method of claim 20, further comprising the step of adjusting the impressed voltage and the temperature of said electrolytic solution so that a high ion concentration area is formed in the vicinity of said anode.

23. The method of claim 20, further comprising the step of scanning said cathode over the surface of said first electrode layer while maintaining a distance between said cathode and said anode to be within a prescribed range and impressing a prescribed voltage between the two.

24. The method of claim 23, wherein the step of scanning includes a plurality of similar cathodes.

25. The method of claim 20, wherein the electrolytic solution is aqua regia and the electrolytic solution has a temperature in the range of 30–70° C.

* * * * *